United States Patent [19]
Schade, Jr.

[11] 3,942,134
[45] Mar. 2, 1976

[54] ASTABLE MULTIVIBRATOR

[75] Inventor: Otto Heinrich Schade, Jr., North Caldwell, N.J.

[73] Assignee: RCA Corporation, New York, N.Y.

[22] Filed: Dec. 3, 1974

[21] Appl. No.: 529,022

[52] U.S. Cl............................ 331/113 R; 307/290
[51] Int. Cl.² ........................................ H03K 3/282
[58] Field of Search......... 307/290; 331/113 R, 144, 331/145

[56] References Cited
UNITED STATES PATENTS

| | | | |
|---|---|---|---|
| 3,201,718 | 8/1965 | Trojak | 331/113 |
| 3,204,195 | 8/1965 | Maestre | 331/113 |
| 3,336,510 | 8/1967 | Itoh | 331/113 |
| 3,341,788 | 9/1967 | Nishioka | 331/113 |
| 3,371,289 | 2/1968 | Luna et al. | 331/113 |

*Primary Examiner*—John Kominski
*Attorney, Agent, or Firm*—H. Christoffersen; Henry I. Schanzer

[57] ABSTRACT

The base of a first transistor is coupled through a first capacitor to the collector of a second transistor and the base of the latter is coupled through a second capacitor to the collector of the first transistor. The capacitors are alternately charged by means of first and second relatively constant current sources connected to the collectors of the first and second transistors, respectively. The charging current supplied by the first current source to the second capacitor flows into the base of the second transistor, causing it to saturate and conduct the current supplied by the second current source. The charging current supplied by the second current source to the first capacitor flows into the base of the first transistor, causing it to saturate and conduct the current supplied by the first current source.

9 Claims, 4 Drawing Figures

ASTABLE MULTIVIBRATOR

This invention relates to switching circuits and in particular to circuits having two quasi-stable states between which the circuits make periodic transitions. These circuits, known in the art as astable multivibrators, are used in many applications specifying a low-cost oscillator or timing circuit requiring little space and consuming little power.

Figure 1:
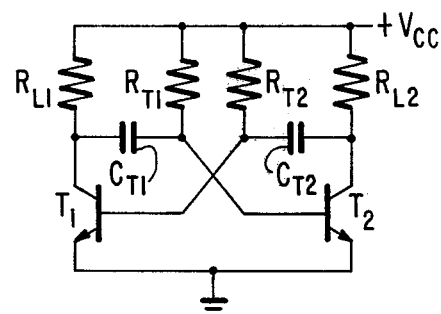
Figure 2:
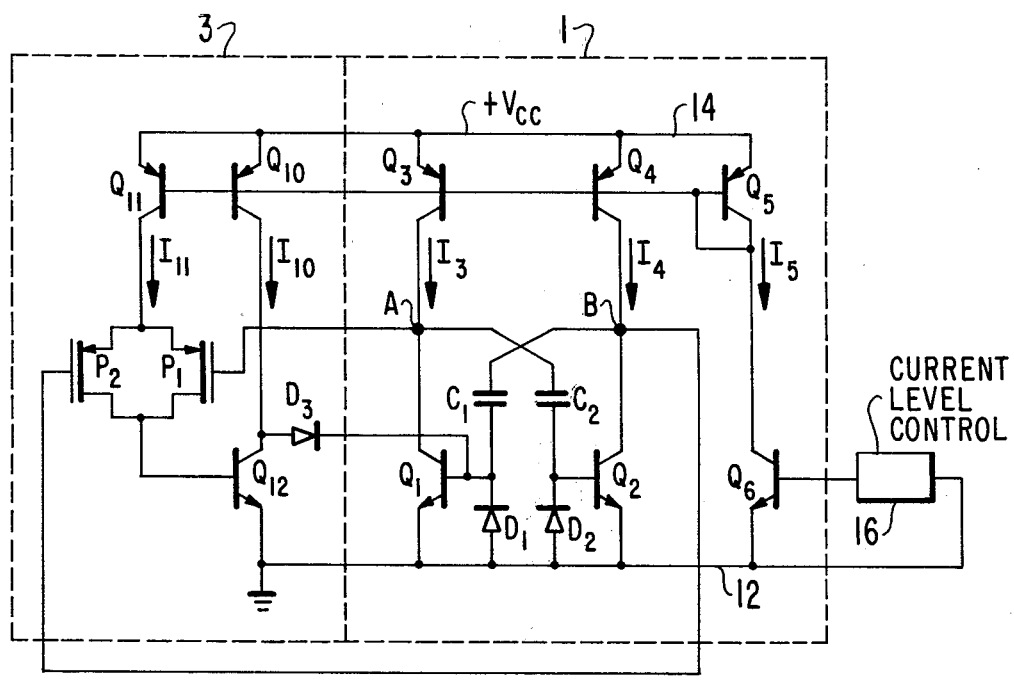
Figure 3:
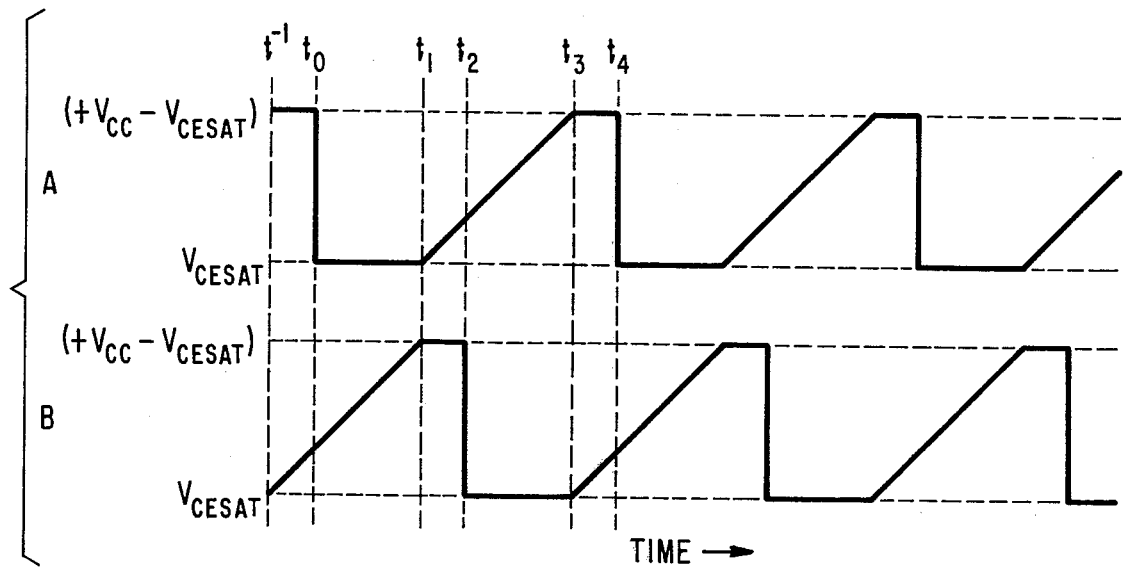
Figure 4:
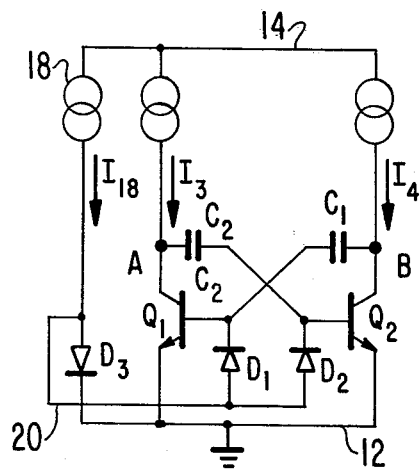

In the accompanying drawings, like reference characteristics denote like components; and FIG. 1 is a schematic drawing of a prior art astable multivibrator, FIG. 2 is a schematic drawing of an astable multivibrator and starting circuit embodying the invention, FIG. 3 is a diagram of idealized waveforms at two nodes of the circuit of FIG. 2; and FIG. 4 is a schematic drawing of a modification to the circuit of a FIG. 2.

In many applications it is desirable to have an astable multivibrator whose frequency of oscillation preferably may be altered without changing the components of the circuit, which is easily integratable, which requires little space, consumes little power and has a minimum number of components.

The prior art circuit of FIG. 1 is used, by way of example, to illustrate some of the features and drawbacks of known astable multivibrators. The astable multivibrator shown in FIG. 1 includes a pair of transistors (T1, T2) where each transistor is connected at its emitter to ground potential and its collector through a load resistor (RL1, RL2) to $+V_{CC}$ volts. The base of each transistor is capacitively coupled by means of a timing capacitor (CT1, CT2) to the collector of the other transistor and a timing resistor (RT1, RT2) is connected between the base of each transistor and $+V_{CC}$ volts.

1. The frequency of oscillation of the multivibrator is controlled primarily by the time constants RT1 × CT1 and RT2 × CT2. To alter the frequency of the multivibrator, the value of the timing resistors or the timing capacitors must be changed. In totally integrated circuitry, for example, this is not practical.

2. In integrated circuits, for example, where only small values of capacitors are readily available, the value of the timing resistors (RT1, RT2) needed to produce low frequencies becomes prohibitively large. For example, where capacitances in the range of 10 picofarads are readily available and a frequency in the range of one kilohertz is desired, the value of the timing resistors must be in the order of 100 megohms. Such a large value of resistance cannot be practically manufactured in integrated circuitry.

3. In conventional circuits, there is constant power dissipation through the timing resistors (RT1, RT2) and through at least one of the load resistors (RL1 and RL2). In applications where the minimization of power is extremely important it is a prime goal to find ways of decreasing the power consumed.

The invention resides in part in the recognition that the timing resistors (RT1, RT2) can be eliminated. In circuits embodying the invention, the functions performed by the timing resistor and the load resistor are replaced by a single current source means, thereby decreasing power dissipation.

Astable multivibrators embodying the invention include first and second transistors with a first capacitor connected between the base of the first transistor and the collector of the second transistor and a second capacitor connected between the base of the second transistor and the collector of the first transistor. First and second current sources connected to the collectors of the first and second transistors, respectively, function to alternatively charge the capacitors and forward bias the transistor whose base is connected to the capacitor being charged.

Circuits embodying the invention may also include a starting circuit connected to one of the first and second transistors to ensure oscillation of the astable multivibrator.

The circuit of FIG. 2 includes an astable multivibrator section 1 and a starting circuit section 3. The astable multivibrator section includes NPN transistors Q1 and Q2 connected at their emitters to ground conductor 12. A timing capacitor C2 is connected between the base of transistor Q2 and node A. The collectors of transistor Q1 and PNP transistor Q3 are also connected to node A. A timing capacitor C1 is connected between the base of transistor Q1 and mode B. The collectors of transistor Q2 and PNP transistor Q4 are also connected to node B. Diodes D1 and D2 are connected at their anodes to conductor 12 and at their cathodes to the bases of transistors Q1 and Q2, respectively. Diodes D1 and D2 provide a discharge path for capacitors C1 and C2, respectively, and also function to clamp the voltage at the bases of transistors Q1 and Q2 to one $V_{BE}$ drop below the potential applied to conductor 12 when there is a negative going transition of the potential at nodes B and A, respectively.

Transistors Q3 and Q4, which function as current sources, have their emitters connected to $+V_{CC}$ volts via conductor 14, and have their bases connected to the base of transistor Q5. The amplitudes of the collector currents $I_3$ and $I_4$ of transistor Q3 and Q4, respectively, are controlled by transistor Q5. The latter is connected at its emitter to conductor 14; its base is connected in common with its collector and with the collector of transistor Q6. Transistor Q6, is connected at its emitter to conductor 12 and at its base to current level control network 16. The control network 16 supplies a current into the base of transistor Q6 which sets the collector current ($I_5$) of transistor Q6 and hence that of transistor Q5. By altering or modifying the current level into the base of transistor Q6, the current $I_5$ is altered and in turn causes a proportional change, in the currents $I_3$ and $I_4$. The variations in the current produced by network 16 may be programmed. The amplitudes of the currents produced by transistors Q3 and Q4 are thus programmable and conceivably may be varied over many orders of magnitude from the subpicoampere range to the ampere range. Practical limitations are imposed by leakage currents at the low end of the current range and by current carrying capacity or forward current gain falloff at the high end of the current range.

Transistors Q3 and Q4 function as, relatively constant current sources in that their collector currents ($I_3$, $I_4$), once set, are relatively independent of the loads connected to their collectors. For transistors Q3 and Q4 to function as constant current sources, they must be operated in the linear range; that is, in the range between cut off and saturation. For ease of the description to follow, it is assumed that $I_3$ is equal to $I_4$ although in practice, $I_3$ and $I_4$ may have different values depending, for example, on the geometries of transistors Q3 and Q4.

It is possible for the astable circuit 1 of FIG. 2 to assume an operating condition in which both capacitors C1 and C2 become fully charged with both transistors Q1 and Q2 being nonconducting and thereby precluding oscillation of the astable multivibrator. To ensure oscillation, a starting circuit 3 is coupled by means of a diode D3 to the astable multivibrator. When the astable circuit is oscillating, diode D3 is rendered nonconducting and the start circuit is effectively isolated from and does not load the astable circuit.

The starting circuit 3 includes PNP transistors Q10 and Q11 which function as relatively constant current sources. Transistors Q10 and Q11 are connected at their emitters to conductor 14 and at their bases to the base of transistor Q5. Diode D3 is connected at its cathode to the base of transistor Q1 and at its node to the collectors of transistor Q10 and NPN transistor Q12. Two enhancement type insulated-gate field-effect transistors, (IGFETs), P1 and P2 of P-conductivity type function as an OR gate and have their source-drain paths connected in parallel between the collector of transistor Q11 and the base of transistor Q12. The gates of transistors P1 and P2 are connected to nodes A and B, respectively, and the emitter of transistor Q12 is connected to conductor 12. IGFETs P1 and P2 are used because their extremely high input impedances ensure little loading on nodes A and B.

Transistors Q3, Q4, Q5, Q10 and Q11 form what is known in the art as a "current mirror amplifier." For purposes of the description below, transistor Q5 is identified as the input transistor and transistor Q3, Q4, Q10 and Q11 as the mirroring transistors. Substantially all of the input current $I_5$ is assumed to flow through the collector-to-emitter path of transistor Q5 and the collector currents $I_3$, $I_4$, $I_{10}$ and $I_{11}$ of transistors Q3 and Q4, Q10 and Q11, respectively, are identified as the mirrored currents. The amplitudes of the input current ($I_5$) and the mirrored currents ($I_3$, $I_4$, $I_{10}$, and $I_{11}$) are related as the ratio of the transconductances of the input transistor (Q5) to the mirroring transistors (Q3, Q4, Q10 and Q11). In an integrated circuit where the transistors are concurrently formed in the same environment, the ratio of the transconductance of each mirroring transistor to that of the input transistor is approximately equal to the ratio of the effective area of the base-to-emitter region of each mirroring transistor to that of the input transistor. Using presently known manufacturing methods and processes, the ratio of the transconductances of the input and mirroring transistors may be accurately reproduced by manufacturing them with identical diffusion (or implantation) profiles and scaling the effective area of their respective base-emitter junctions.

The input transistor Q5 is connected as a shunt regulator by means of the collector-to-base connection which provides feedback between its collector and base. Due to the relatively high forward current gain of the input transistor and the mirroring transistors it may be assumed that very little base current is drawn by these transistors. Nevertheless, some of the input current $I_5$ flows through the base-to-emitter region of transistor Q5 and establishes the base-to-emitter potential necessary for substantially all of the input current $I_5$ to flow through the collector to emitter path of the input transistor Q5. The base-to-emitter potential of transistor Q5 is applied across each one of the mirroring transistors and causes output currents ($I_3$, $I_4$, $I_{10}$ and $I_{11}$) to flow which are proportional to the input current. These currents are supplied by the transistors Q3, Q4, Q10, Q11, which function as programmable, relatively constant current sources.

The operation of the astable multivibrator of FIG. 2 is best explained by considering one cycle of its operation. Assume, initially, that the potential at node B is close to ground potential, that transistor Q2 is nonconducting, and that the collector current $I_4$ of transistor Q4 flows into capacitor C1, displacing a current into the base of transistor Q1 and causing it to saturate. A transistor saturates when its base current ($I_b$) multiplied by its forward current gain ($\beta$) is greater than the available collector current ($I_c$). When a transistor saturates, its collector-to-emitter voltage ($V_{CESAT}$) may be typically, 0.2 or 0.3 volts. Transistor Q1 is driven into saturation since: (1) its base current, $I_4$, is substantially equal to the available collector current $I_3$; (2) substantially all of $I_4$ flows into the base of transistor Q1; and (3) Q1 has a relatively high forward current gain ($\beta$). When transistor Q1 is saturated, all of the current ($I_3$) produced by current source Q3 flows through its collector-to-emitter path and the potential at its collector, node A, is equal to $V_{CESAT}$ above ground. Since transistor Q1 is forward biased by current $I_4$, its base and the side or terminal of capacitor C1 connected thereto are at $V_{BE}$ volts above ground; where $V_{BE}$ volts is, typically, 0.7 volts. As long as the amplitude of the current $I_4$ is constant, the potential across capacitor C1, and hence at node B, rises linearly as shown for the period $t_0$ to $t_1$ in waveform B of FIG. 3.

The potential at node B, which is common to the collector of transistor Q4, continues to increase until its potential becomes more positive than the base potential of transistor Q4. As the potential at node B becomes more positive, the emitter-to-collector potential of transistor Q4 decreases until it becomes equal to the value of $V_{CESAT}$ of transistor Q4 and transistor Q4 no longer functions as a constant current source. Its collector current then decreases considerably and it now supplies insufficient base drive to the base of transistor Q1 to maintain it in saturation. As a result, the current $I_3$ which had been sunk by transistor Q1 now begins to flow through capacitor C2 into the base of transistor Q2. The current $I_3$ initially charges the base to emitter capacitance to transistor Q3, raising the potential at the base of transistor Q2 from $-V_{BE}$ volts to $+V_{BE}$ volts. This corresponds to the period from time $t_1$ to $t_2$ in FIG. 3. During this time interval the potential at node B, as shown in waveform B, is $+V_{CC}-V_{CESAT}$ volts while the potential at node A is increasing linearly. At time $t_2$ the potential at the base of transistor Q2 reaches $+V_{BE}$ volts and transistor Q2 turns on, causing the potential at node B to drop from $+V_{CC}-V_{CESAT}$ volts to within a $V_{CESAT}$ of ground potential. This large negative transition is coupled through capacitor C1 to the base of transistor $Q_1$. However, with diode D1 in the circuit the potential at the base of transistor Q1 is held at $-V_{BE}$ volts below ground and a discharge path is provided for capacitor C1. As soon as the potential at node B goes sufficiently negative diode D1 conducts in the forward direction. Current flows from the cathode of diode D1, through capacitor C1 into node B and through the collector-to-emitter path of transistor Q2 back to conductor 12 and the anode of D1. The forward voltage drop ($V_F$) of diode D1 is assumed to be equal to the $V_{BE}$ of the transistors. Thus, with diode D1 in the circuit, the potential at the base of transistor Q1 and at the terminal of capacitor C1 connected thereto is clamped at $-V_{BE}$ volts and the other terminal of C1 connected to node B is held at $V_{CESAT}$ volts.

Transistor Q1 is cutoff and, being cut off, cannot conduct collector current. Therefore, the constant current $I_3$ produced by current source transistor Q3 flows through capacitor C2 into the base of transistor Q2. Transistor Q2 saturates since $I_3$ is substantially equal to $I_4$, and its forward current gain is considerably greater than one. Therefore, the potential at its collector and hence at junction B is held at $V_{CESAT}$ above ground. Since transistor Q2 conducts all the $I_4$ current, it prevents current flow into C1 and maintains transistor Q1 in the cutoff condition. As the potential across capacitor C2 increases due to the flow of charging current $I_3$, the potential at the collector of transistor Q3 becomes more positive than the potential at its base. Transistor Q3 then saturates and the base drive to transistor Q2 becomes negligible. As the base drive to transistor Q2 decreases, it conducts or sinks less collector current, and the current $I_4$ begins to flow through capacitor C1, charging up the base-to-emitter region of transistor Q1 from $-V_{BE}$ volts to $+V_{BE}$ volts. As soon (at time $t_4$) as the base of transistor Q1 is charged to $+V_{BE}$ volts, transistor Q1 turns on sharply, causing the potential at node A to drop from $V_{CC}-V_{CESAT}$ volts to within $V_{CESAT}$ of ground potential. This causes a large negative potential to be coupled through capacitor C2 to the base of transistor Q2, causing diode D2 to conduct in the forward direction and clamp the base of transistor Q2 to $-V_{BE}$ volts below ground potential. This cuts off transistor Q2 and causes all of the $I_4$ current to flow through capacitor C1 into the base of transistor Q1. At this point, a full cycle of operation has been completed and a new cycle begins.

The frequency of oscillation of the multivibrator is determined by the time it takes the collector current source Q3 for transistor Q1 to charge the capacitor C2 and the time it takes the collector current source Q4 to charge capacitor C1, where the capacitors are charged between, approximately, zero volts and $V_{CC}$ volts.

A circuit was tested in which C1 and C2 were each made equal to 10 picofarads. As transistors Q3 and Q4 were controlled to supply currents ($I_3$ and $I_4$) which varied between 10 picoamperes and 5 microamperes, the frequency of the signals at nodes A and B was observed to vary range between 0.1Hz and 10KHz. Transistors Q3 and Q4 may be designed to handle currents varying from below the picoampere region into the high milliampere region, thereby extending the frequency range of the astable multivibrator.

It is important to note that in circuits embodying the invention, the current source in the collector circuit of one transistor provides the charging current for the timing capacitor connected between the collector of the one transistor and the base of the other transistor and the charging current is in a direction to forward bias the other transistor. Thus, each current source is alternately used to charge a capacitor to a given level and as a load source to a transistor. Also, in circuits embodying the invention the functions performed by the timing and load resistors of the prior art circuit of FIG. 1 are combined and performed by a single current source (Q3, Q4). Furthermore, in contrast to prior art circuits, it is the current sources in the collector loads which in combination with the timing capacitors determine the period of the output waveform.

In conventional circuits the charging path for each capacitor includes the timing resistor and the collector-to-emitter path of the transistor to whose collector the capacitor is connected. In contrast thereto, in circuits embodying the invention the charging path for each timing capacitor (C1 and C2) includes the collector current source of one transistor and the base-to-emitter path of the other transistor.

It should be noted that resistors are not necessary to form the astable multivibrator section 1 or the starting circuit 3. This makes the circuit of FIG. 2 easy to integrate and readily operable over a wide current range.

When the astable multivibrator is oscillating, the starting circuit 3 is isolated from the astable multivibrator and it has substantially no effect or control over the astable multivibrator. When the astable multivibrator is oscillating, the potential at node A or at node B is low. A low at node A or B causes transistor P1 or P2, respectively, to conduct, thereby providing a low impedance conduction path between the collector and base of transistors Q11 and Q12, respectively. The collector current of transistor Q11 flowing into the base of transistor Q12 saturates the latter. Transistor Q12 normally "sinks" the collector current of transistor Q10 and maintains the potential at the anode of diode D3 close to ground potential preventing any current flow through the latter into the base of transistor Q1.

If the astable multivibrator is not oscillating, the potentials at nodes A and B are simultaneously at or close to $+V_{CC}$ volts. This condition causes transistors P1 and P2 to be nonconducting, inhibiting the flow of current into the base of transistor Q12, which also then is non-conducting. Current source transistor Q10 then supplies current through diode D3 into the base of transistor Q1 causing it to turn on and the potential at point A to go low. The negative going transition at node A initiates oscillation of the multivibrator and concurrently disconnects the starting circuit. With either of nodes A or B at a low potential, transistors P1 or P2 are turned on and diode D3 is nonconducting.

During the time it takes the current source to raise the base potential of transistor Q1 or Q2 from $-V_{BE}$ volts to $+V_{BE}$ volts, there is a transition zone as illustrated by the flat portions of waveforms B and A from times $t_1$ to $t_2$ and from times $t_3$ to $t_4$, respectively. Intervals $(t_1 - t_2)$ and $(t_3 - t_4)$ are $V_{BE}$ dependent and hence subject to temperature variations.

The transition zone time may be decreased by returning the anodes of diodes D1 and D2 of FIG. 1 to a more positive potential than the one applied to conductor 12. This may be achieved, for example, by modifying the astable section 1 of FIG. 2 as shown in FIG. 4. In the circuit of FIG. 4, transistors Q1 and Q2 and capacitors C1 and C2 are interconnected as in FIG. 2. Transistors Q3 and Q4 of FIG. 1 are replaced by symbols for current sources.

Diodes D1 and D2 are connected at their cathodes to the bases of transistors Q1 and Q2, respectively, and at their anodes to conductor 20. Conductor 20 is connected to the anode of diode D3 whose cathode is returned to conductor 12. A current source 18 connected between conductor 14 and the anode of diode D3 supplies a current $I_{18}$ which flows through diode D3 and establishes a potential of $V_{BE}$ volts between conductors 20 and 12. When the potential at node A or B makes a negative going transition, diode D1 or D2 conducts in the forward direction. The diode D1 or D2 then clamps the base of its respective transistor to one $V_{BE}$ drop below the potential on conductor 20, that is, essentially at ground potential. The discharge path for capacitors C1 and C2 includes conduction through source 18. It should be evident that still other alternative means are available for holding the bases of the off transistor at a potential closer to its conduction level.

What is claimed is:

1. The combination comprising:
   first and second transistors, each transistor having a base, an emitter, and a collector;
   a first capacitor connected between the base of said first transistor and the collector of said second transistor;
   a second capacitor connected between the base of said second transistor and the collector of said first transistor;
   a point of fixed potential;
   means connecting the emitters of said first and second transistors to said point of fixed potential;
   means comprised solely of first and second current sources connected to the collectors of said first and second transistors, respectively, for alternately charging said capacitors and supplying a forward bias through the capacitors to the bases of said transistors; and
   means responsive to the potentials at the collectors of said first and second transistors for applying a forward bias to one of said first and second transistors when both of said first and second transistors are nonconducting and their collector potentials are at the same level.

2. The combination as claimed in claim 1, wherein said first and second current sources are sources of relatively constant current.

3. The combination as claimed in claim 2 further including current level setting means connected to said relatively constant current sources for setting their current levels at selected levels.

4. The combination as claimed in claim 3, wherein each one of said first and second relatively constant current sources includes a transistor having a relatively fixed potential applied between its base and emitter and wherein the collector of the transistor of said first current source is connected to the collector of said first transistor and the collector of the transistor of said second current source is connected to the collector of said second transistor.

5. The combination as claimed in claim 3 further including unidirectional conducting means connected to the base of each one of said first and second transistors to prevent excessive reverse bias potential from being applied between the base and emitter of the transistor to which it is connected, and being poled in a direction to provide a discharge path for the capacitor connected to the base of the transistor to which the unidirectional element is connected.

6. The combination as claimed in claim 1, wherein said means responsive to the potentials at the collectors includes first and second level sensing transistors each having a control electrode and a main conduction path, wherein the control electrode of said first level sensing transistor is connected to the collector of said first transistor and wherein the control electrode of said second level sensing transistor is connected to the collector of said second transistor; means connecting said main conduction paths of said first and second level sensing transistors between a source of current and a current control means coupled to said one of said first and second transistors; and
   wherein said current control means is responsive to the nonconduction through said main conduction paths of said first and second level sensing transistors for applying a forward bias to the base of one of said first and second transistors.

7. The combination as claimed in claim 1, wherein said first and second transistors are of first conductivity type;
   wherein each one of said first and second current sources includes a transistor of second conductivity type; the collector of the transistor of said first current source being connected to the collector of said first transistor and the collector of the transistor of said second current source being connected to the collector of said second transistor; and
   wherein said current source further includes means for applying a potential between the base and emitter of said transistors of said current sources for controlling the conductivity of said transistors.

8. The combination as claimed in claim 6 wherein said current control means includes:
   1. a normally clamped transistor connected at its control electrode to one end of the conduction paths of said first and second level sensing transistors;
   2. a current source connected to one end of the conduction path of said normally clamped transistor;
   3. means connecting said one end of the conduction path of said normally clamped transistor to said base of one of said first and second transistors; and
   4. means connecting the other end of the conduction path of said normally clamped transistor to said point of fixed potential.

9. The combination as claimed in claim 7 wherein said means for applying a potential between the base and emitter of said transistors of said current sources for controlling the conductivity of said transistors includes an additional transistor of said second conductivity type having its emitter connected to the emitter of said transistors of said current sources and having its base and collector connected to the bases of said transistors of said current sources; and
   means connected to the collector and base of said additional transistor for varying its current level whereby the current levels in said current source transistors are varied.

* * * * *